(12) United States Patent
Iacoponi et al.

(10) Patent No.: US 6,448,099 B1
(45) Date of Patent: Sep. 10, 2002

(54) METHOD AND APPARATUS FOR DETECTING VOLTAGE CONTRAST IN A SEMICONDUCTOR WAFER

(75) Inventors: John A. Iacoponi, Austin, TX (US); Tom Spikes, Jr., Round Rock, TX (US); John Miethke, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 37 days.

(21) Appl. No.: 09/723,485

(22) Filed: Nov. 28, 2000

(51) Int. Cl.[7] ........................... H01L 31/26; H01L 21/66
(52) U.S. Cl. ........................................... 438/17; 438/14
(58) Field of Search ................................ 438/9, 14, 15, 438/16, 17, 18

(56) References Cited

U.S. PATENT DOCUMENTS 5,521,516 A * 5/1996 Hanagama et al.

* cited by examiner

Primary Examiner—David Nelms
Assistant Examiner—Phuc T. Dang
(74) Attorney, Agent, or Firm—Williams, Morgan & Amerson

(57) ABSTRACT

A method is used to test a semiconductor wafer for misaligned layers formed therein. The method comprises forming a plurality of electrically conductive connections on a surface of the semiconductor wafer. A portion of the electrically conductive connections are coupled to a voltage supply. Thereafter, a voltage contrast analysis of the surface of the semiconductor wafer is performed, and a first pattern of the plurality of electrically conductive connections coupled to the voltage supply is determined from the voltage contrast analysis. The method further comprises comparing the first pattern to a desired pattern, and indicating an error in response to the first pattern differing from the desired pattern.

17 Claims, 6 Drawing Sheets

METHOD AND APPARATUS FOR DETECTING VOLTAGE CONTRAST IN A SEMICONDUCTOR WAFER

BACKGROUND OF THE INVENTION

1. Field of the Invention

This invention relates generally to semiconductor manufacturing structures and techniques, and, more particularly, to a structure useful in detecting erroneous electrical connections in a semiconductor device.

2. Description of the Related Art

Integrated circuits, or microchips, are manufactured from modem semiconductor devices containing numerous structures or features, typically the size of a few micrometers. The features are placed in localized areas of a semiconducting substrate, and are conductive, non-conductive, or semiconductive (i.e., rendered conductive in defined areas with dopants). The fabrication process generally involves processing a number of wafers through a series of fabrication tools. Each fabrication tool performs one or more of four basic operations discussed more fully below. The four basic operations are performed in accordance with an overall process to produce wafers from which the semiconductor devices are obtained.

Integrated circuits are manufactured from wafers of a semiconducting substrate material. Layers of materials are added, removed, and/or treated during fabrication to create the integrated electrical circuits that make up the device. The fabrication essentially comprises the following four basic operations:

- layering, or adding thin layers of various materials to a wafer from which a semiconductor is produced;
- patterning, or removing selected portions of added layers;
- doping, or placing specific amounts of dopants in selected portions of the wafer through openings in the added layers; and
- heat treating, or heating and cooling the materials to produce desired effects in the processed wafer.

Although there are only four basic operations, they can be combined in hundreds of different ways, depending upon the particular fabrication process. See, e.g., Peter Van Zant, *Microchip Fabrication A Practical Guide to Semiconductor Processing* (3d Ed. 1997 McGraw-Hill Companies, Inc.) (ISBN 0-07-067250-4).

The integrated circuits must be patterned in the precise dimensions required by the circuit design and located in their proper place on the wafer. Forming parts with such precise dimensions implicates what is known as "critical dimension control." "Critical dimensions" include, among other things, the line widths of the electrically conductive traces and the width of the insulating materials between the traces that define the pattern. Critical dimension control ensures that portions of the pattern containing critical dimensions are formed precisely. Locating the parts in their proper place implicates what is known as "overlay control," i.e., ensuring that the pattern being fabricated is properly aligned relative to previously formed patterns. This is accomplished by ensuring that a reticle (or mask) used in forming the pattern being fabricated is properly aligned with the wafer prior to beginning the processing operation. Simply put, overlay control ensures that the reticle precisely overlays, or is aligned with, the wafer.

Proper alignment and dimension control are necessary to avoid failure of the electrical circuits employed across an integrated circuit. For instance, if vias (i.e., conductive plugs or openings between layers) are not properly positioned over electrically conductive traces, parts of the circuit that should electrically communicate with each other may actually be electrically isolated from each other. Even if this extreme scenario does not occur, slight misalignment or poor dimensioning may cause devices to receive voltages or currents that are less than the designed or targeted amount, thereby degrading device performance.

Critical dimension control and overlay control are also important because successive steps of the fabrication process tend to be interdependent. A slight variation in the parameter(s) of one process step can be compounded by a variation in the parameters of a second process step to produce unacceptable numbers of defective product at the output end of the mass-production line. The efficacy of critical dimension control and overlay control are also interdependent. For instance, overlay control involves measuring the misalignment between two successive patterned layers on the surface of a semiconductor device.

Generally, minimization of misalignment errors is important to ensure that the multiple layers of the semiconductor devices are connected and functional. As technology facilitates smaller critical dimensions for semiconductor devices, the need for reduced misalignment errors increases dramatically to ensure functional circuits.

Microscopic dimensional capabilities of current semiconductor manufacturing equipment make possible the design of digital circuits that may be very complex and yet extremely economical in space, power requirements and cost. At the same time, however, the microscopic dimensions of current semiconductor manufacturing also amplifies the effects of even small errors or mistakes in the manufacturing process. Sometimes, an error or mistake can cause major economic loss. It is therefore important to discover, not only that there are defects in the wafer manufacturing process, but also exactly what is causing those defects. Because of the complexities in design and fabrication, considerable effort goes into testing.

One particular form of failure analysis is commonly referred to as "voltage contrast analysis." In this form of analysis, the surface of the wafer is charged, and the charge patterns of various die on the wafer are compared. More particularly, the wafer is scanned by a scanning electron microscope ("SEM"). The light beam charges the insulators and ungrounded conductors, but does not charge the grounded conductors, as any charge is dissipated through the ground connection. When the scanned wafer surface is examined with the SEM, the charged insulator will appear light, or white, and the uncharged conductors appear dark, or black. Several individual die, typically three, are then examined simultaneously using a pattern-recognition and matching technique. If two of the three match, the third die is flagged as defective on the assumption the process performs reliably. A variety of commercially available tools perform this type of analysis, including the SEMSpec Metrology Tool available from KLA-Tencor, Inc., 160 Rio Robles, San Jose, Calif. 95134, USA.

FIGS. 1A and 1B further illustrate voltage contrast analysis. FIGS. 1A and 1B illustrate, in cross-section, portions of two die 100, 120 that were designed to be substantially identical, but owing to variations in the manufacturing process, are different. The two die 100, 120 each consist of five layers 102, 104, 106, 108, and 110. Each of the layers 102, 104, 106, and 108 comprises conducting portions 112 and insulating portions 114. The layer 110 is a conductor 112 serving as a ground plane. The conducting portion 112 of the layer 106 does not contact the conducting portion 112 of the layer 108 in the die 100, but does so in the die 120. Thus, the conducting portions 112 in the die 120 are grounded, but the conducting portions 112 in the layers 102, 104, and 106 of the die 100 are not, i. e., they "float." When scanned by an SEM (not shown), the conducting portion 112 in the layer 102 of the die 100 will charge, and will appear white during the examination. The same conducting portion 112 in the layer 102 of the die 120 will not charge, because it is grounded, and will appear black during the examination.

This voltage contrast analysis suffers from several drawbacks, however. The approach of comparing like die to detect improper electrical connections has proven problematic, owing to its inability to detect common errors. That is, where the same improper electrical connection exists in all of the analyzed semiconductor die, comparing the voltage contrast of the die will not result in the improper electrical connection being detected. Owing to the repetitive nature of the manufacturing process, when an error, such as misalignment, has occurred in one wafer, it is likely to be replicated in many other wafers. Thus, comparing like wafers may fail to reveal like errors.

The present invention is directed to overcoming, or at least reducing the effects of, one or more of the problems set forth above.

SUMMARY OF THE INVENTION

In one aspect of the present invention, a method is provided. The method is used to test a semiconductor wafer. The method comprises forming a plurality of electrically conductive connections on a surface of a semiconductor wafer. A portion of the electrically conductive connections are coupled to a voltage supply. Thereafter, a voltage contrast analysis of the surface of the semiconductor wafer is performed, and a first pattern of the plurality of electrically conductive connections coupled to the voltage supply is determined from the voltage contrast analysis. The method further comprises comparing the first pattern to a desired pattern, and indicating an error in response to the first pattern differing from the desired pattern.

In another aspect of the present invention, a test structure is formed on a semiconductor wafer. The test structure comprises a plurality of electrically conductive connections arranged in an n×m array on a surface of the semiconductor wafer, an electrically conductive substrate; and a first and second plurality of electrical interconnections. The first plurality of electrical interconnections extends between at least a portion of the electrically conductive connections and the electrically conductive substrate in a preselected pattern, wherein the first plurality of electrical interconnections are capable of removing charge introduced to the electrically conductive connections during a voltage contrast analysis. The second plurality of electrical interconnections extends partially between at least a portion of the electrically conductive connections and the electrically conductive substrate in a preselected pattern.

In another aspect of the present invention, a system for identifying misaligned layers in a semiconductor wafer is provided. The system comprises a voltage contrast metrology tool and a controller. The voltage contrast metrology tool is capable of performing a voltage contrast analysis on a region of a surface of the semiconductor wafer. The region comprises a plurality of electrically conductive connections, at least a portion of which are coupled to a power supply. The voltage contrast metrology tool determines a first preselected pattern of the electrically conductive connections coupled to the power supply. The controller is capable of comparing the first preselected pattern to a desired pattern, and indicating the presence of a misaligned layer in response to detecting a difference there between.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1A:
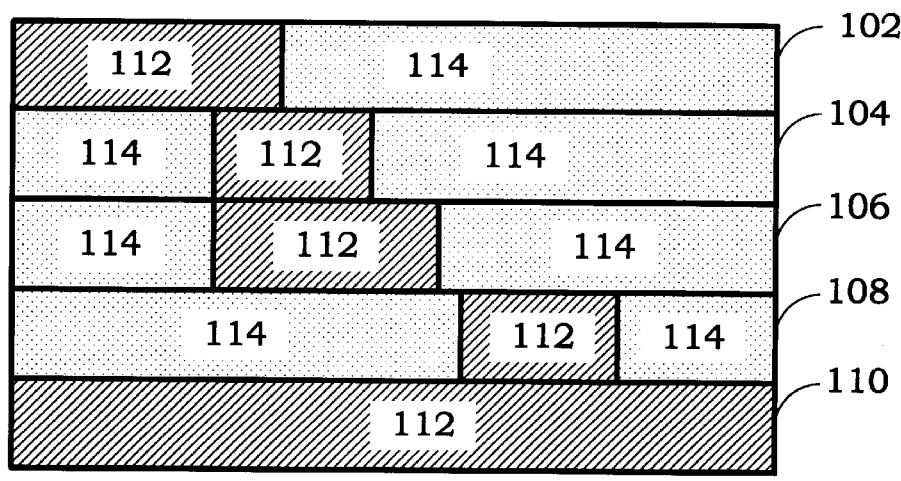
FIGS. 1A–1B are cross-sectional views of two die illustrating conditions highlighting deficiencies in prior art voltage contrast analysis techniques.
Figure 1B:
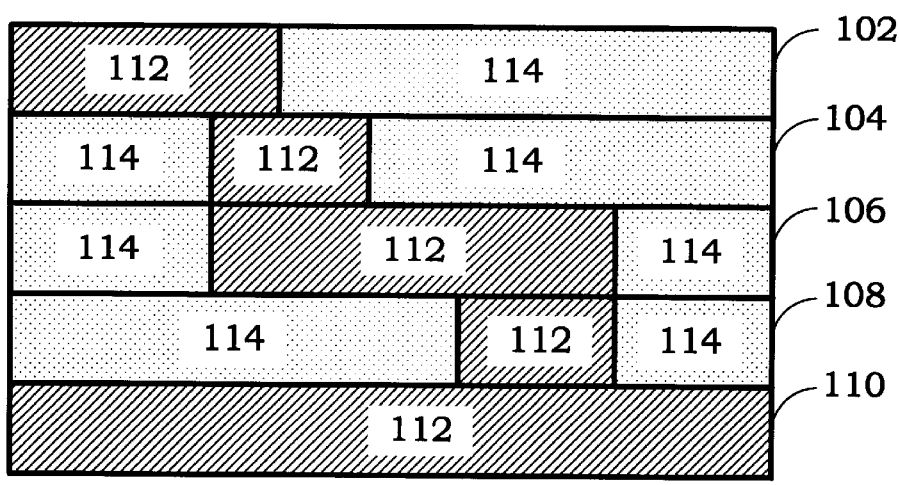

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–5. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of enhancing the accurate detection of erroneously formed electrical connections in a semiconductor device. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
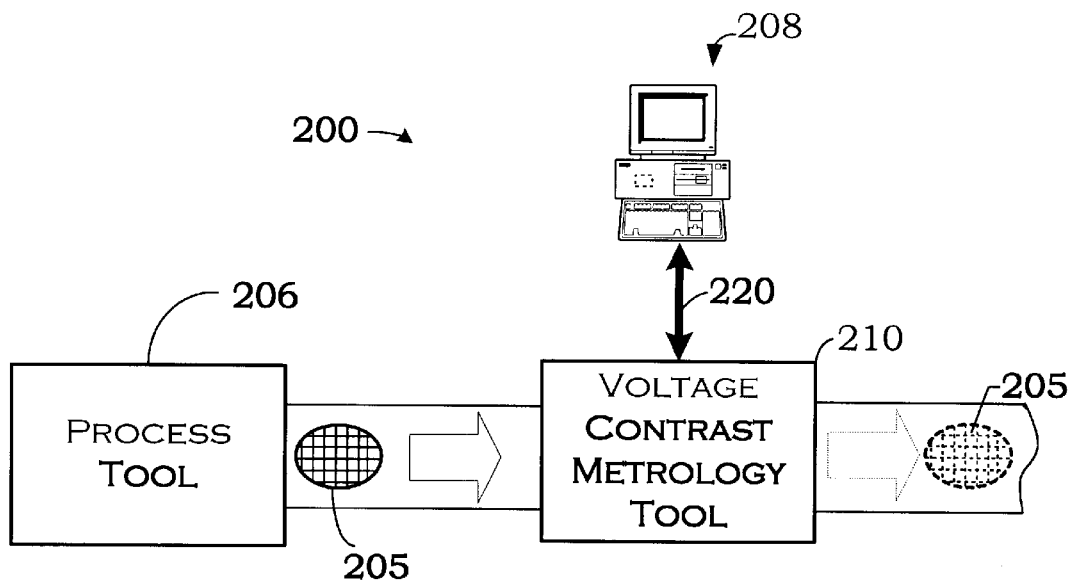
FIG. 2 is a conceptual, block diagram of one embodiment of an apparatus of the instant invention.

Referring now to the drawings, and beginning with FIG. 2, one illustrative embodiment of a system 200 that may be used with the present invention is illustrated. As shown therein, the system 200 for processing wafers 205 is comprised of a process tool 206, such as a photolithography tool, an etcher, a stepper, an oven, a metalization tool, etc., an automatic process controller 208, and a voltage contrast metrology tool 210, such as. The controller 208 may take a variety of forms. For example, the controller 208 may be included within either the process tool 206 or the voltage contrast metrology tool 210, or it may be a separate device electrically coupled to the voltage contrast metrology tool 210 via a line 220. In the embodiment illustrated herein, the controller 208 takes the form of computer that is controlled by a variety of software programs. The software programs that relate to information obtained from the voltage contrast metrology tool 210 are discussed in greater detail below in conjunction with FIGS. 4A–E and 5. Those of ordinary skill in the art will appreciate that the controller 208 need not rely on software for its functionality, but rather, a hardware controller may be used to provide the functionality described herein and attributed to the controller 208.

The controller 208, in the embodiment shown in FIG. 2, is a desktop personal computer. However, this is not necessary to the practice of the invention. Alternative embodiments of the present invention might implement the controller 208 in a workstation, a notebook computer, or even a mainframe computer, for instance. Some embodiments might even embed the controller 208 in the voltage contrast metrology tool 210. In these embodiments, the controller 208 might be a processor, such as a microprocessor or a digital signal processor, or a micro-controller. The only technical requirement in the implementation of the controller 208 is that it possess enough computing power to implement the invention as described herein.

The present invention may be employed on a lot-by-lot basis and/or on a wafer-by-wafer basis. In general, the more frequent the measurements, the more accurate will be the identification of misaligned layers. That is, alignment of the layers need not be measured on each wafer 205, but rather, a single or small group of wafers 205 may be selected and analyzed as being representative of the other wafers in a lot or larger group. The number of wafers processed between measurements is a matter of design discretion, which depends substantially on the details of the particular embodiment.

In the illustrated embodiment, the automatic process controller 208 is a computer programmed with software to implement the functions described. However, as will be appreciated by those of ordinary skill in the art, a hardware controller (not shown) designed to implement the particular functions may also be used. Moreover, the functions of the controller 208 described herein may be performed by one or more processing units that may or may not be geographically dispersed. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the automatic process controller 208, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 3:
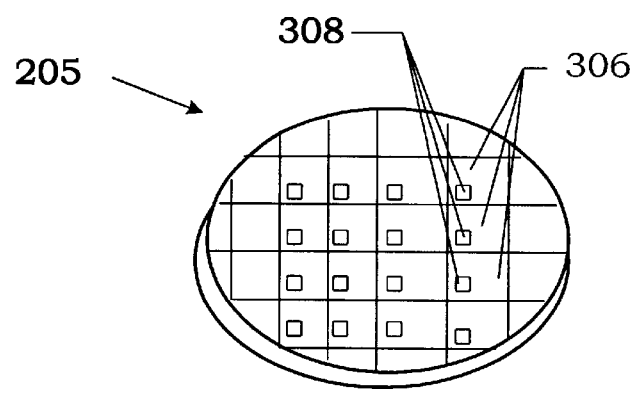
FIGS. 3 illustrates a schematic orthogonal view of a semiconductor wafer in which the instant invention may be embodied.

FIG. 3 illustrates an orthogonal view of the semiconducting wafer 205. The wafer 205 comprises a plurality of patterned die 306. In this particular embodiment, each of the plurality of patterned die 306 comprises a test pattern 308. Other embodiments may be used that have a test pattern 308 disposed on only select die 306 on the wafer 205. In fact, in some embodiments only a single test pattern 308 may be used for an entire wafer.

Figure 4A:
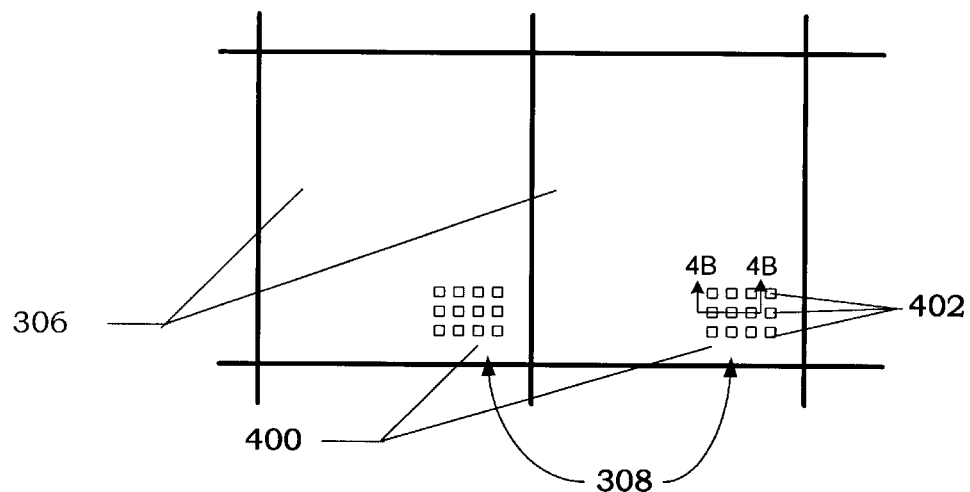
FIGS. 4A illustrates a stylized top view of a portion of the semiconductor wafer of FIG. 3 in which a test structure is found.

FIG. 4A illustrates the test pattern 308 in greater detail. In the embodiment illustrated in FIG. 4A, the test pattern 308 takes the form of an array 400 arranged in an n×m pattern. The size of the array 400 may vary widely according to the requirements of the wafer/die on which it is being used. That is, selection of the size of the array 400 is a matter of design discretion that will depend on a number of factors, such as the size of the wafer, the size of the die, the number of die, expected or observed alignment variations existing at various locations on the die/wafer, etc. It should be appreciated that the drawings presented herein are not to scale, and, in fact, the size of the test patterns 308 are greatly exaggerated relative to the size of the die 306. In practice, the test patterns 308 may occupy a substantially smaller portion of the die 306. Further, while the test pattern is illustrated as being in a 3×4 array, it should be appreciated that substantially more elements may be employed.

In the embodiment illustrated in FIG. 4A, each element of the array 400 is an electrically conductive region 402 that has various underlying connections positioned to selectively couple the conductive regions 402 to an underlying electrically grounded substrate. The underlying electrical connections are formed in a plurality of underlying layers (see FIG. 4B, for example). The pattern with which the conductive regions are coupled to electrical ground is known, such that variations therefrom are indicative of an alignment error.

Figure 4B:
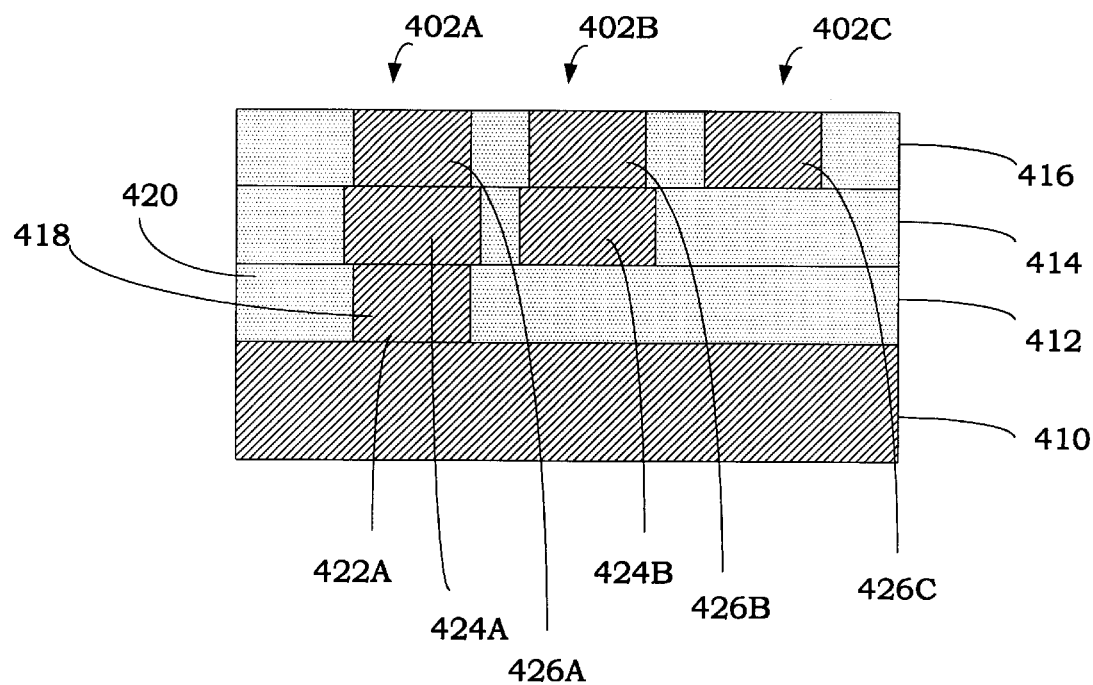
FIG. 4B illustrates one embodiment of a schematic cross-sectional view of a portion of the test structure of FIG. 4A.

FIG. 4B illustrates a stylistic cross section through a portion of the array 400 showing three different types of conductive devices (402A–402C) that may be employed in each of the conductive regions 402. That is, each conductive region 402 may be comprised of an array of one of the types of conductive devices 402A–402C. For example, one of the conductive regions 402 may be comprised of hundreds or even thousands of the conductive devices 402A, while another conductive region 402 may likewise be comprised of hundreds or even thousands of the conductive devices 402B. Sufficient conductive devices 402A–402C should be used to provide a good signal to noise ratio when the wafer is subjected to a voltage contrast analysis.

The test pattern 308 is formed by a series of four layers 410, 412, 414, 416. The layer 410 is conductive, and during the testing process is electrically grounded. The layers 412–416 may generally include two types of components, conductive regions 418 and nonconductive regions 420. The conductive region 418 in the layer 412 is commonly referred to as a contact 422A. The conductive regions 418 in the layer 414 are commonly referred to as metalization layers 424A, 424B. The conductive regions 418 in the layer 416 are commonly referred to as a vias 426A, 426B, 426C.

Figure 4C:
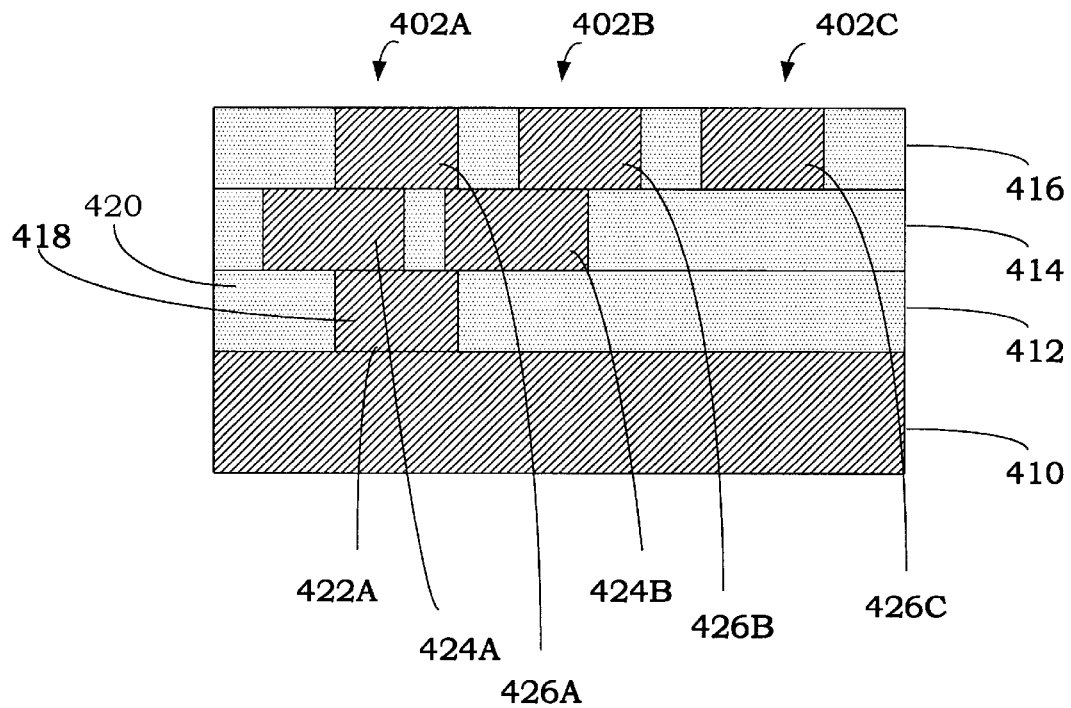
FIG. 4C illustrates a schematic cross-sectional view of the portion of the test structure of FIG. 4B with a metalization layer misaligned therein.
Figure 4D:
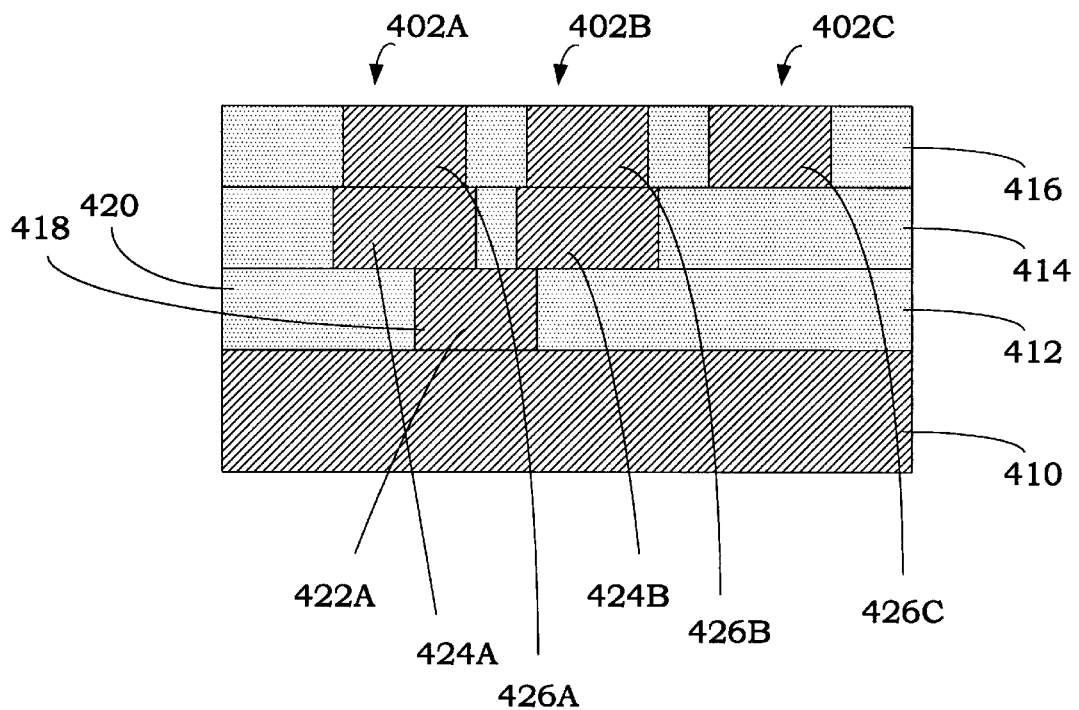
FIG. 4D illustrates a schematic cross-sectional view of the portion of the test structure of FIG. 4B with an electrical contact misaligned therein.
Figure 4E:
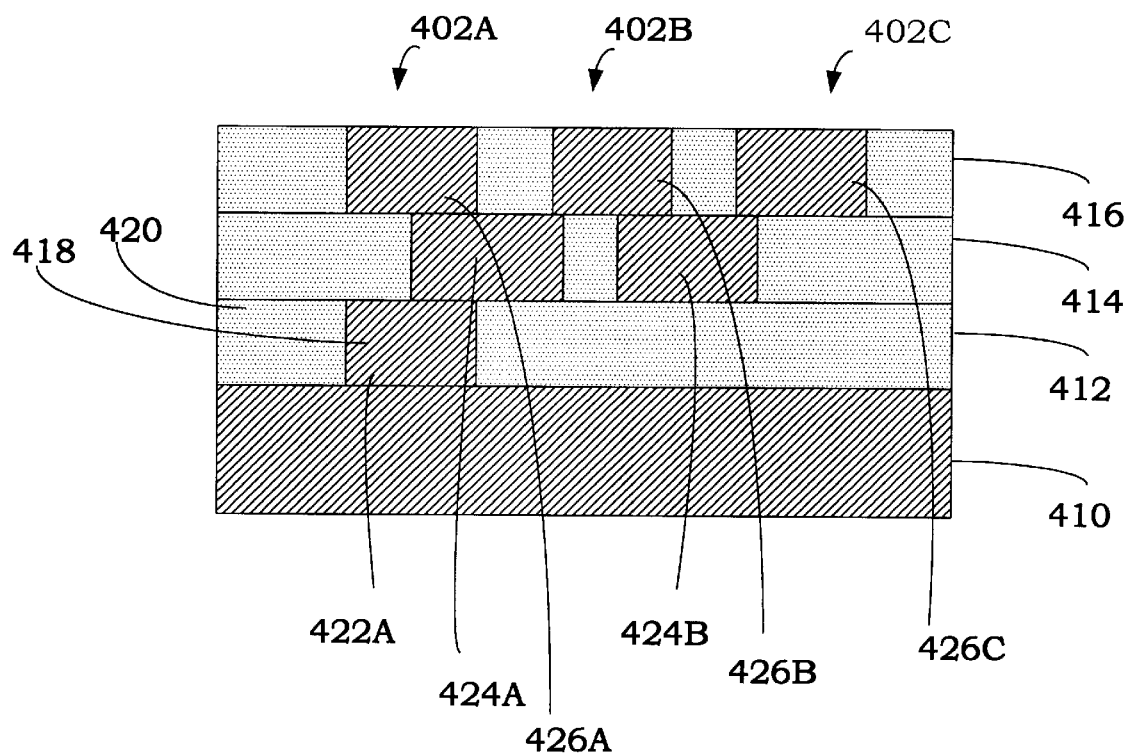
FIG. 4E illustrates a schematic cross-sectional view of the portion of the test structure of FIG. 4B with an electrical contact misaligned therein.

When the layers 410–416 are properly aligned, the conductive regions 418 should be positioned as shown in FIG. 4B (FIGS. 4C–4E show various misalignments of the layers 410–416). When the test pattern 308 is subjected to a voltage contrast analysis, the scanning electron microscope (SEM) will detect the conductive region 402A as lightly colored since the via 426A is connected to electrical ground through the metalization layer 424A, contact 422A, and conductive layer 410. The conductive region 402B, on the other hand, will appear dark, as the via 426B and metalization layer 424B are isolated from the conductive layer 410 by the nonconductive portion 420 of the layer 412. Likewise, the conductive region 402C will appear dark, as the via 426C is isolated from the conductive layer 410 by the nonconductive portions 420 of the layers 412, 414. The pattern of the properly aligned conductive regions 402A, 402B, 402C may be represented by the binary code 100.

FIG. 4C illustrates a situation where the layer 414 has been misaligned, shifting the metalization layer 424A, 424B in the negative X direction (to the left in the drawing). This misalignment of the layer 414 electrically couples the via 426B to electrical ground through the metalization layer 424B, the contact 422A, and the layer 410. Thus, when the test pattern 308 is subjected to a voltage contrast analysis, the SEM will detect both of the conductive region 402A, 402B as lightly colored. The pattern of the misaligned conductive regions 402A, 402B, 402C may be represented by the binary code 110.

FIG. 4D illustrates a situation where the layer 412 has been misaligned, shifting the contact 422A in the positive X direction (to the right in the drawing). This misalignment of the layer 412 electrically couples the via 426B to electrical ground through the metalization layer 424B, the contact 422A, and the layer 410. Thus, when the test pattern 308 is subjected to a voltage contrast analysis, the SEM will again detect both of the conductive region 402A, 402B as lightly colored. The pattern of the misaligned conductive regions 402A, 402B, 402C may again be represented by the binary code 110.

FIG. 4E illustrates a situation where the layer 414 has been misaligned, shifting the metalization layer 424A, 424B in the positive X direction. This misalignment of the layer 414 electrically couples the vias 426B, 426C to electrical ground through the metalization layer 424B, the contact 422A, and the layer 410. Thus, when the test pattern 308 is subjected to a voltage contrast analysis, the SEM will detect all three of the conductive region 402A, 402B, 402C as lightly colored. The pattern of the misaligned conductive regions 402A, 402B, 402C may be represented by the binary code 111.

Other misalignments of the layers 412–416 may similarly impact the pattern detected by a voltage contrast analysis. For example, similar misalignments of the layer 416 may produce patterns differing from the expected pattern of 100. Further, misalignments in the Y direction (see FIG. 4A) may also be detected by an array 400 that has at least 2×3 in size.

Figure 5:
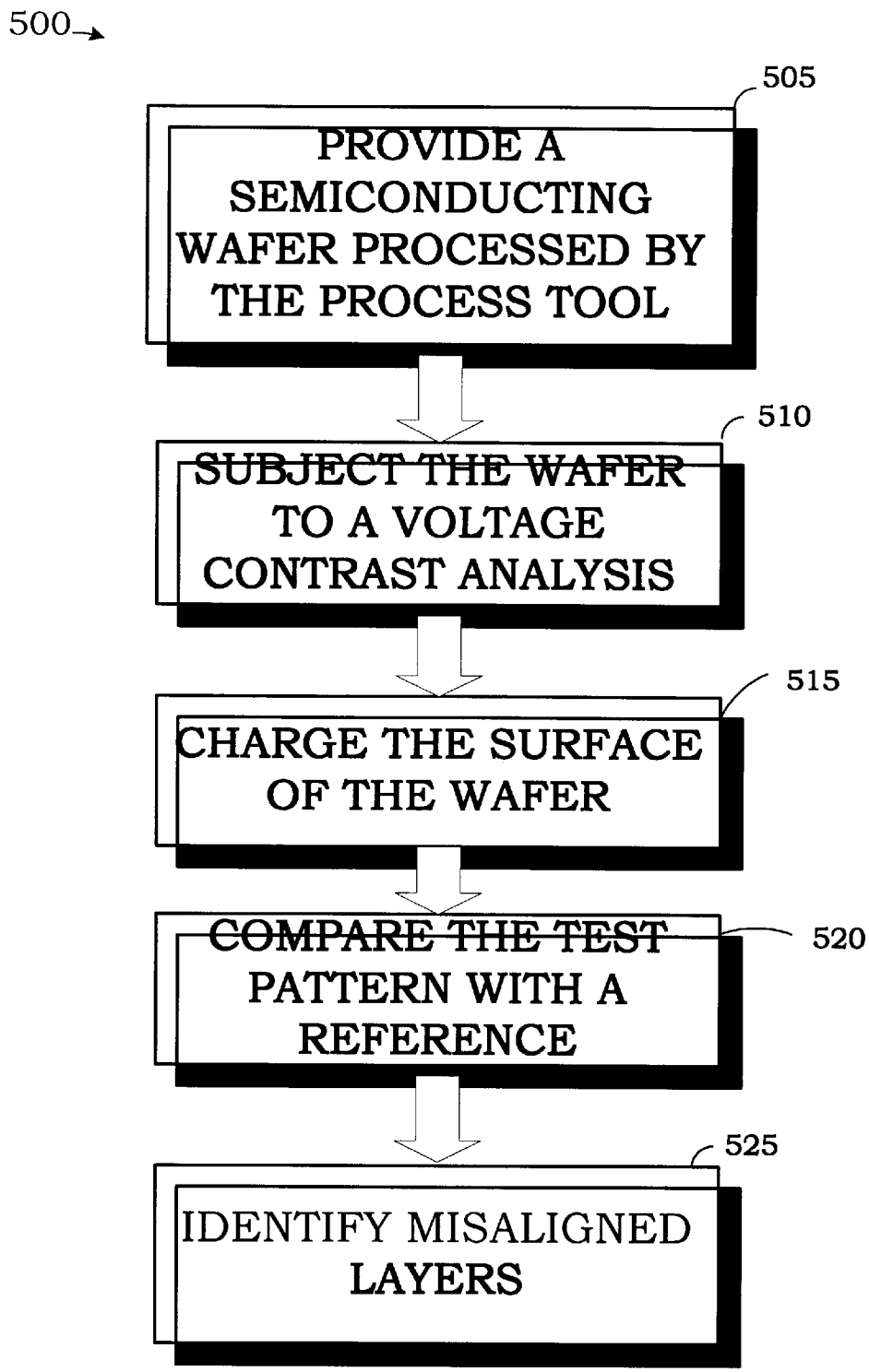
FIG. 5 illustrates one embodiment of a flowchart representation of a software program that may be operated by the system of FIG. 2.

Turning now to FIG. 5, one embodiment of a flowchart representation of a software routine 500 that may be executed by the automatic process controller 208 to identify misaligned layers of the semiconductor wafer 205 is shown. The routine begins at block 505 with the semiconductor wafer 205 being delivered from the process tool 206 to the VCM tool 210. In block 510, the routine causes the VCM tool 210 to begin performing a voltage contrast analysis on the wafer 205.

At block 515, the VCM tool 210 scans an electron beam across the surface of the wafer 205, charging the insulated regions. At block 520, the routine ascertains the pattern of light and dark regions on the surface of the wafer in the region of the test pattern 308, and then compares the detected pattern with an expected pattern stored in memory.

Differences in the detected versus expected pattern cause the routine 500 to flag the wafer 205 as having alignment problems. These alignment problems may be communicated directly to an operator at the facility and/or to an automated error logging system, which may be included within the APC 208 or an external system electrically coupled thereto.

The detected pattern may also be communicated to the operator or otherwise logged as an additional aid in divining the nature of the misalignment. That is, the detected pattern may be used to narrow the range of potential misalignment problems. For example, if a pattern of 111 is detected, the operator may surmise that one possible misalignment problem is that the layer 414 has been shifted in the positive X direction. Other patterns may be indicative of other types of misalignments. Once the misalignment problem has been identified, corrective actions may be taken.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for testing a semiconductor wafer, comprising:

forming a plurality of electrically conductive connections on a surface of a semiconductor wafer;

coupling a portion of said electrically conductive connections to a voltage supply;

performing a voltage contrast analysis of the surface of said semiconductor wafer;

determining from said voltage contrast analysis a first pattern of said plurality of electrically conductive connections coupled to the voltage supply;

comparing said first pattern to a desired pattern; and indicating an error in response to said first pattern differing from said desired pattern.

2. A method, as set forth in claim 1, wherein coupling a portion of said electrically conductive connections to a voltage supply comprises coupling a portion of said electrically conductive connections to ground.

3. A method, as set forth in claim 1, wherein coupling a portion of said electrically conductive connections to a voltage supply comprises:

coupling a semiconductor substrate to ground;

forming at least one nonconductive layer above said substrate;

forming openings in said nonconductive layer to expose said substrate; and depositing electrically conductive material in said openings.

4. A method, as set forth in claim 3, wherein forming a plurality of electrically conductive connections on a surface of a semiconductor wafer comprises forming a first portion of said electrically conductive connections above said electrically conductive material deposited in said openings, and a second portion of said electrically conductive connections above said nonconductive layer.

5. A method, as set forth in claim 1, wherein performing a voltage contrast analysis of the surface of said semiconductor wafer comprises scanning an electron beam over the surface of said semiconductor wafer, and identifying areas on the surface of said semiconductor wafer that do not retain an electrical charge.

6. A method, as set forth in claim 5, wherein determining from said voltage contrast analysis the first pattern comprises identifying the areas that do not retain a charge that correspond with the electrical connections of the desired pattern.

7. A test structure formed on a semiconductor wafer, comprising:

a plurality of electrically conductive connections arranged in an n×m array on a surface of the semiconductor wafer;

an electrically conductive substrate; and a first plurality of electrical interconnections extending between at least a portion of the electrically conductive connections and the electrically conductive substrate in a preselected pattern, wherein the first plurality of electrical interconnections are capable of removing charge introduced to the electrically conductive connections during a voltage contrast analysis; and a second plurality of electrical interconnections extending partially between at least a portion of the electrically conductive connections and the electrically conductive substrate in a preselected pattern.

8. A test structure, as set forth in claim 7, wherein said first plurality of electrically conductive connections include a contact and a metalization layer serially coupled between the electrically conductive connections and the electrically conductive substrate.

9. A test structure, as set forth in claim 7, wherein said second plurality of electrically conductive connections include a metalization layer serially coupled to the electrically conductive connections and extending toward the electrically conductive substrate.

10. A process controller for identifying misaligned layers in a semiconductor wafer, comprising:

means for performing a voltage contrast analysis of the surface of said semiconductor wafer, wherein a test structure having a plurality of electrically conductive connections is disposed on the surface thereof, and a plurality of the electrically conductive connection are coupled to a voltage supply;

means for determining from said voltage contrast analysis a first pattern of said plurality of electrically conductive connections coupled to the voltage supply;

means for comparing said first pattern to a desired pattern; and means for indicating an error in response to said first pattern differing from said desired pattern.

11. A system for identifying misaligned layers in a semiconductor wafer, comprising:

a voltage contrast metrology tool capable of performing a voltage contrast analysis on a region of a surface of the semiconductor wafer, wherein the region comprises a plurality of electrically conductive connections, at least a portion of which are coupled to a power supply, to determine a first preselected pattern of the electrically conductive connections coupled to said power supply; and a controller capable of comparing the first preselected pattern to a desired pattern, and indicating the presence of a misaligned layer in response to detecting a difference there between.

12. A computer programmed to perform a method for identifying misaligned layers in a semiconductor wafer, the method comprising:

performing a voltage contrast analysis of the surface of said semiconductor wafer, wherein a test structure having a plurality of electrically conductive connections is disposed on the surface thereof, and a plurality of the electrically conductive connection are coupled to a voltage supply;

determining from said voltage contrast analysis a first pattern of said plurality of electrically conductive connections coupled to the voltage supply;

comparing said first pattern to a desired pattern; and indicating an error in response to said first pattern differing from said desired pattern.

13. A computer, as set forth in claim 12, wherein performing a voltage contrast analysis of the surface of said semiconductor wafer comprises scanning an electron beam over the surface of said semiconductor wafer, and identifying areas on the surface of said semiconductor wafer that do not retain an electrical charge.

14. A computer, as set forth in claim 13, wherein determining from said voltage contrast analysis the first pattern comprises identifying the areas that do not retain a charge that correspond with the electrical connections of the desired pattern.

15. A method for testing a semiconductor wafer, comprising:

forming a first layer on an electrically conductive substrate, said first layer having a plurality of contacts formed therein in a first preselected pattern;

forming a second layer above said first layer, said second layer having a plurality of metalized regions formed therein in a second preselected pattern;

forming a third layer having a plurality of vias formed therein and extending onto a surface thereof in a third preselected pattern, at least a portion of said first, second and third patterns being aligned to form an electrically conductive path between at least a portion of said vias and said substrate;

coupling said substrate to a voltage supply;

performing a voltage contrast analysis of the surface of the third layer;

determining from said voltage contrast analysis a detected pattern of said plurality of vias coupled to the substrate;

comparing said detected pattern to a desired pattern; and indicating an error in response to said detected pattern differing from said desired pattern.

16. A method, as set forth in claim 15, wherein coupling said substrate to a voltage supply comprises coupling said substrate to ground.

17. A method, as set forth in claim 15, wherein performing a voltage contrast analysis of the surface of the third layer comprises scanning an electron beam over the surface of the third layer, and identifying areas on the surface of the third layer that do not retain an electrical charge.

* * * * *